United States Patent [19]
Sumnitsch

[11] Patent Number: 6,056,825
[45] Date of Patent: May 2, 2000

[54] ROTARY CHUCK INCLUDING PINS FOR LIFTING WAFERS

[75] Inventor: Franz Sumnitsch, Klagenfurt, Austria

[73] Assignee: SEZ Semiconductor-Equipment Zubehor fur die Halbleiterfertigung AG, Villach, Austria

[21] Appl. No.: 09/098,507

[22] Filed: Jun. 17, 1998

[30] Foreign Application Priority Data

Jun. 18, 1997 [AT] Austria .................................. 1060/97

[51] Int. Cl.$^7$ ................................................. C23C 16/00
[52] U.S. Cl. ........................ 118/730; 118/728; 118/729; 269/21
[58] Field of Search .................... 118/728, 729, 118/730; 269/20, 21

[56] References Cited

U.S. PATENT DOCUMENTS

| | | |
|---|---|---|
| 4,903,717 | 2/1990 | Sumnitsch . |
| 5,071,485 | 12/1991 | Matthews et al. . |
| 5,447,570 | 9/1995 | Schmitz et al. . |
| 5,452,905 | 9/1995 | Bohmer et al. . |
| 5,492,566 | 2/1996 | Sumnitsch . |
| 5,513,668 | 5/1996 | Sumnitsch . |
| 5,553,994 | 9/1996 | Biche et al. . |
| 5,626,675 | 5/1997 | Sakamoto et al. . |
| 5,695,568 | 12/1997 | Sinha et al. . |
| 5,762,391 | 6/1998 | Sumnitsch . |
| 5,848,670 | 12/1998 | Salzman ............................. 118/728 X |

FOREIGN PATENT DOCUMENTS

| | | |
|---|---|---|
| 000 639 | 2/1996 | Austria . |
| 0 250 064 | 12/1987 | European Pat. Off. . |
| 0 676 793 | 10/1995 | European Pat. Off. . |
| 0 798 775 | 10/1997 | European Pat. Off. . |
| 0 809 278 | 11/1997 | European Pat. Off. . |
| 0 821 404 | 1/1998 | European Pat. Off. . |
| 0 833 374 | 4/1998 | European Pat. Off. . |
| WO 94/29036 | 12/1994 | WIPO . |
| WO 95/11518 | 4/1995 | WIPO . |
| WO 97/03457 | 1/1997 | WIPO . |

*Primary Examiner*—Jeff H. Aftergut
*Attorney, Agent, or Firm*—Young & Thompson

[57] ABSTRACT

In a chuck (1) for disk-like objects (silicon wafers), there are several lifting devices with respect to surface (4) of chuck (1) that faces toward the object, where the lifting devices are designed as, e.g., pegs (2) that are run out vertically with respect to surface (4) of chuck (1) that faces toward the object and can be retracted back into surface (4). By means of pegs (2), the distance between the object and chuck (1) can be increased in order to mount objects on chuck (1) and remove them therefrom, so that, especially when silicon wafers are handled, the spoon-like devices that are used to place these wafers onto receiving trays and remove them therefrom can also be used.

8 Claims, 2 Drawing Sheets

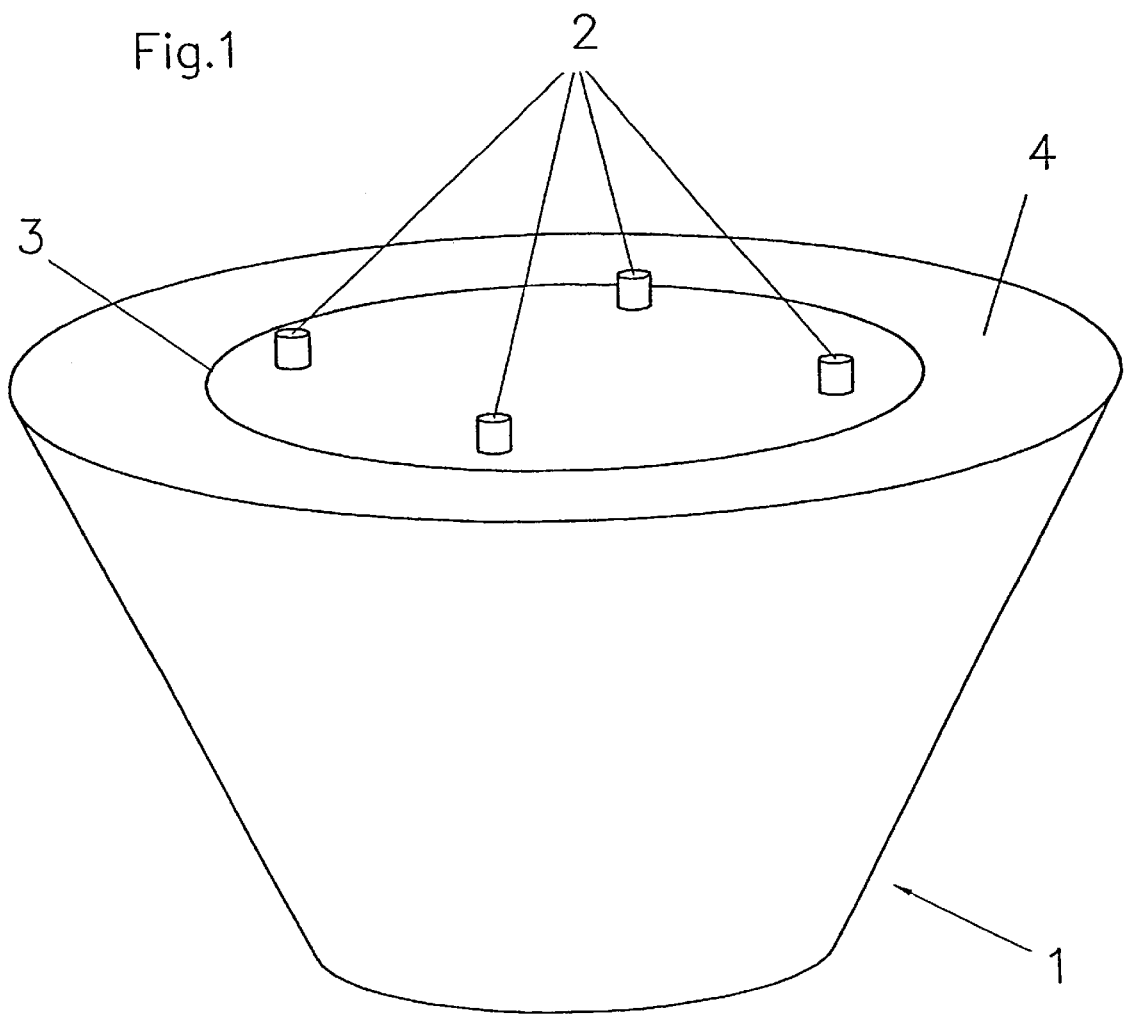

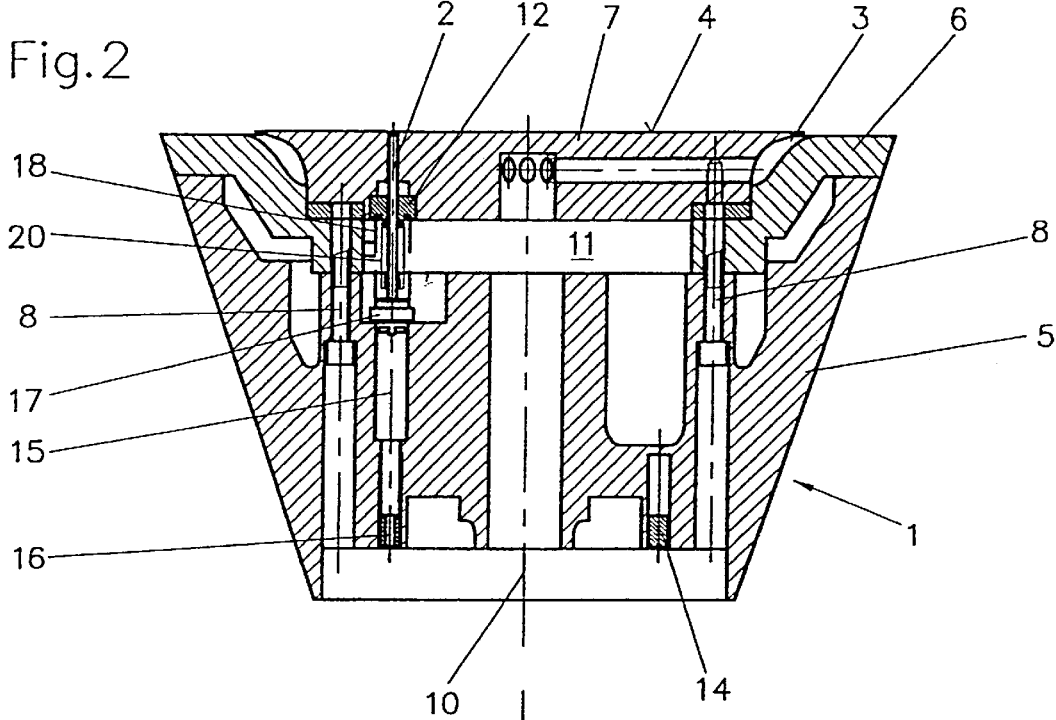
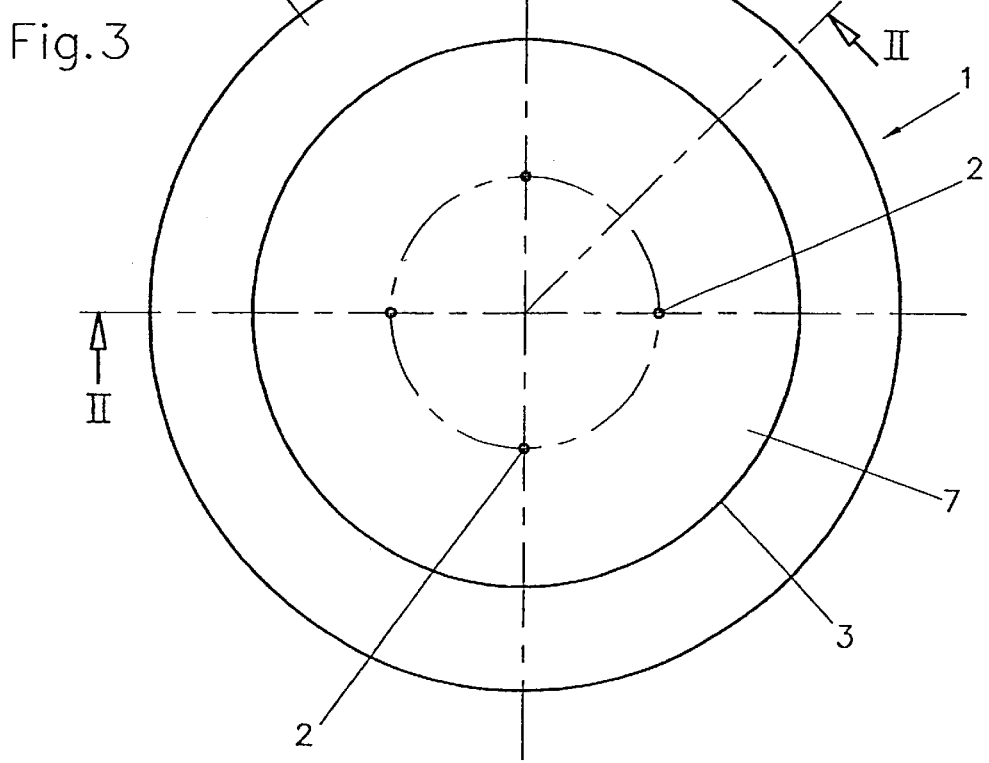

ROTARY CHUCK INCLUDING PINS FOR LIFTING WAFERS

BACKGROUND OF THE INVENTION

The invention pertains to process for handling disk-like objects using a chuck.

The invention further pertains to a chuck for disk-like objects, with which disk-like objects can be held during treatment steps and can be caused to rotate and with which the process of the invention can be carried out. In particular, such chucks are intended for holding (silicon) wafers and rotating them while they are being treated, e.g., etched, polished, and washed.

Chucks of this type come in basically two designs. In the side of the chuck facing toward the object, one design has pins (U.S. Pat. No. 4,903,717 and U.S. Pat. No. 5,513,668) by which the disk-like objects are laterally supported, while they are held against the chuck under the action of the gas emerging from a ring nozzle, primarily according to the Bernoulli principle. In another design of such chucks for disk-like objects (WO 97/03457), such pins are not provided since the object is held against the chuck by an underpressure that is applied to, e.g., ring-shaped projections on the chuck surface facing the object.

Up until now, the mounting of a disk-like object, especially a (silicon) wafer, on a chuck and removal of the object therefrom have been laborious processes. The reason for this is that in the case of chucks that are equipped with pins there is only a very small gap between the object and the surface of the chuck facing it, and in chucks against which objects are held by means of underpressure there is virtually no gap. Thus, up until now it has not been possible to use the known spoons or forks with which disk-like objects, especially silicon wafers, can be grasped from below in order to mount them onto the chuck and remove them therefrom. Such spoons are, however, used to remove wafers from support trays in supply containers (carrier boxes) and to put them back into these boxes.

To solve this problem, various gripping devices have been proposed for disk-like objects (wafers). For example, see the gripper shown in AT 000 640 U1 or WO 95/11518. Such grippers work adequately, especially if there is a gap (albeit a small one) between the disk-like object and the chuck, but they require that, both to mount the disk-like object and to remove it, a second gripper (spoon) be used to empty/fill the support trays in supply containers.

SUMMARY OF THE INVENTION

The object of the invention is to propose a procedure (process) by which the mounting and removal of disk-like objects onto and from chucks is simplified. Another object of the invention is to make available a device that is suitable for implementation of the process.

According to the invention, these objects are achieved by means of the features of the process and device described and claimed herein.

With the approach of the invention, to mount and remove the objects it is now possible to use, e.g., the known spoons or forks with which disk-like objects are usually removed from carrier boxes. The approach of the invention advantageously avoids a step where the grip is switched during both mounting and removal of the disk-like object since the disk-like object (e.g., a silicon wafer) can be mounted on the chuck with the same spoon as was used to remove it from a carrier box. The same thing is also true of the removal of the disk-like object from the chuck and its return to the carrier box in the container.

The approach of the invention is made possible by the fact that the disk-like object is lifted from the chuck surface facing it while at the same time a gap is formed, so that a device for gripping the disk-like object (e.g., a known spoon or the gripper known from WO 95/11518) can be inserted between the chuck and the object.

It is advantageous that during treatment (for instance, etching, polishing, etc. of silicon wafers) the disk-like object can be lowered onto the chuck surface that faces toward it and thus the undesirable gap during treatment/working can be reduced.

BRIEF DESCRIPTION OF THE DRAWINGS

Additional features and details of the invention are presented in the description given below, in which reference is made to the embodiment shown in the drawing of the chuck according to the invention, which in the drawing is depicted in schematic form. Here:

FIG. 1 shows an oblique view of a chuck;

FIG. 2 shows a section along line II—II of FIG. 3; and

FIG. 3 shows a top view of a chuck.

DESCRIPTION OF THE PREFERRED EMBODIMENTS

Chuck 1, which is shown in the drawings, is designed without pins (WO 97/03457), i.e., in its upper surface that faces toward the object it has no pins that grip the lateral edge of the disk-like object (silicon wafer) and support it on the sides. In surface 4 of chuck 1 that faces toward the object, there is a ring-shaped nozzle 3, from which the gaseous medium, nitrogen in both cases, emerges.

For further details regarding the structure and function of chucks against which the disk-like objects are forced by means of an underpressure, see WO 97/03457.

Chuck 1 may also have a structure in which pins are provided in the surface that faces the object in order to provide lateral support for the disk-like object (U.S. Pat. No. 4,903,717). As described in U.S. Pat. No. 5,513,668, these pins may also be radially adjustable.

On chuck 1 according to the invention, inside of ring-shaped nozzle 3 there are several (in this embodiment four) pegs 2, which in FIG. 1 are shown in their position extended out over surface 4 of chuck 1 that faces toward the object.

Pegs 2 correspond to drives or a common drive, not shown in FIG. 1, which is preferably accommodated inside chuck 1 so that it can be run out over surface 4 of chuck 1 that faces toward the object or can be retracted into said surface 4.

Said drive or drives may be purely mechanical drives, pneumatic drives, or combined mechanical-pneumatic drives. In principle, it is also possible to provide electrical or electromagnetic drives for adjusting pegs 2 vertically with respect to surface 4 of chuck 1 that faces toward the object.

To adjust the distance between the disk-like object and surface 4 of chuck 1 that faces toward it, pegs 2 in surface 4 that faces toward the object can be replaced by, e.g., radially oriented strips and/or ring-shaped or partially ring-shaped strips that can be adjusted to lift the object off of chuck 1 in the direction of the axis of chuck 1. Combinations of straight and/or curved strips and/or pegs 2 are also conceivable.

To remove or mount the disk-like object, chuck 1 is rotated in such a way that telescoping pegs 2 or the strips do not impede the motion, which is radially oriented with respect to chuck 1, of an, e.g., spoon-like device with which disk-like objects (silicon wafers) are moved.

FIG. 2 shows an example of a possible embodiment of the drive for pegs 2 ("spacers") that are to serve as the device for increasing or decreasing the distance between the disk-like object and surface 4 of chuck 1.

Even though it is not essential to the implementation of the example of the drive, FIG. 2 shows that chuck 1 is composed of three parts 5, 6, and 7, which are connected together by screws 8.

FIG. 2 also shows that ring-shaped nozzle 3 is limited by areas of parts 5 and 6 that face toward one another.

In part 7, pegs 2 can be adjusted parallel to axis 10 of chuck 1. The holes in which pegs 2 are guided are sealed with seals 12 with respect to chamber 11 that is exposed to pressurized gas.

In part 5 of chuck 1, there is a ring 14, which can be moved in the direction of axis 10 of chuck 1 by means of an, e.g., hydraulic or pneumatic activation device (not shown) (pneumatic cylinder or hydraulic cylinder). For each peg 2 there is a push bar 15, which is screwed into a threaded hole in ring 14 with an exterior threading attachment. In holes that are tapered in accordance with their outer contours, push bars 15 are housed in part 5 of chuck 1 in such a way that they can move parallel to the direction of axis 10 of chuck 1.

The front end of each push bar 15 faces towards an actuation cup 17 at pegs 2. When they actuate ring 14, push bars 15 grip at said cups 17, so that pegs 2 are pushed forward over surface 4 of chuck 1 that faces toward the object.

Retraction of pegs 2 is ensured by pusher springs 18, which rest on seals 12 and on cups 17.

Inside of each pusher spring 18 there is an expansion bellows 20, which is tightly attached to seal 12, on the one hand, and, on the other, to cup 17 of pegs 2. Each expansion bellows 20 surrounds the section of pegs 2 that lies inside chamber 11.

In summary, the preferred embodiment of the chuck according to the invention can be described as follows:

In a chuck 1 for disk-like objects (silicon wafers), with respect to surface 4 of chuck 1 that faces toward the object there are several lifting devices that are designed as, e.g., pegs 2; said lifting devices can be run out vertically with respect to surface 4 of chuck 1 that faces toward the object and can be retracted into said surface 4. By means of said pegs 2, the distance between the object and chuck 1 can be increased for the purpose of mounting objects on chuck 1 and for removing them therefrom, so that especially when silicon wafers are being handled, the spoon-like devices that are used to place the wafers into trays and remove them therefrom can be used.

What is claimed is:

1. A rotatable chuck for holding a disc-shaped object, the chuck comprising:

a top surface that is arranged to hold a disc-shaped object;

a rotational axis about which the chuck rotates;

plural holes that each extend into said top surface in a direction parallel to said rotational axis;

plural pins, each of said plural pins being in a respective one of said plural holes and being moveable between a first position where a top of said pin extends above said top surface and a second position where the top of said pin does not extend above said top surface;

a common drive for moving all of said pins to said first position; and plural springs, each of said plural springs being associated with a respective one of said holes and urging a respective one of said pins to said second position.

2. Chuck according to claim 1, further comprising a ring-shaped nozzle in said top surface for holding the disc-shaped object, a chamber in the chuck for supplying a gas to said nozzle, and plural expansion bellows, each of said expansion bellows being in said chamber and having a respective one of said pins extending therethrough.

3. Chuck according to claim 2, wherein said springs are coil springs, and wherein said expansion bellows are each in a respective one of said coil springs.

4. Chuck according to claim 1, wherein said pins are arranged uniformly around a circumference of said top surface.

5. Chuck according to claim 1, further comprising push bars that are connected to said common drive and that each push a respective one of said pins, said common drive being associated with an air-oil cylinder.

6. Chuck according to claim 5, wherein said common drive is a ring that can be adjusted in the chuck.

7. Chuck according to claim 6, wherein said push bars are screwed to said ring.

8. Chuck according to claim 5, wherein bottoms of said pins are adjacent to said push bars and have cups.

* * * * *